(12) United States Patent
LoCascio et al.

(10) Patent No.: US 8,368,048 B2
(45) Date of Patent: Feb. 5, 2013

(54) NANOSTRUCTURED LAYERS, METHODS OF MAKING NANOSTRUCTURED LAYERS, AND APPLICATION THEREOF

(75) Inventors: Michael LoCascio, Clifton Park, NY (US); San Ming Yang, Troy, NY (US)

(73) Assignee: Nanoco Technologies, Ltd. (GB)

( * ) Notice: Subject to any disclaimer, the term of this patent is extended or adjusted under 35 U.S.C. 154(b) by 0 days.

(21) Appl. No.: 12/826,860

(22) Filed: Jun. 30, 2010

(65) Prior Publication Data

US 2010/0270511 A1 Oct. 28, 2010

Related U.S. Application Data

(62) Division of application No. 12/001,581, filed on Dec. 11, 2007, now Pat. No. 7,785,657.

(60) Provisional application No. 60/874,043, filed on Dec. 11, 2006.

(51) Int. Cl.
*H01L 29/06* (2006.01)
(52) U.S. Cl. .................. 257/13; 977/778; 257/E33.003
(58) Field of Classification Search ............... 257/13, 257/14
See application file for complete search history.

(56) References Cited

U.S. PATENT DOCUMENTS

| | | | |
|---|---|---|---|
| 5,262,357 A | 11/1993 | Alivisatos et al. | |
| 5,272,357 A | 12/1993 | Morishita | |
| 5,537,000 A | 7/1996 | Alivisatos et al. | |
| 5,714,766 A | 2/1998 | Chen et al. | |
| 6,878,871 B2 | 4/2005 | Scher et al. | |
| 7,068,898 B2 | 6/2006 | Buretea et al. | |
| 7,087,832 B2 | 8/2006 | Scher et al. | |
| 7,087,833 B2 * | 8/2006 | Scher et al. | 136/252 |
| 7,150,910 B2 * | 12/2006 | Eisler et al. | 428/325 |
| 7,375,011 B1 | 5/2008 | Kahen | |
| 7,605,062 B2 * | 10/2009 | Kahen | 438/502 |
| 7,615,800 B2 * | 11/2009 | Kahen | 257/103 |
| 2005/0051766 A1 * | 3/2005 | Stokes et al. | 257/17 |
| 2008/0230120 A1 | 9/2008 | Reddy | |
| 2008/0236660 A1 * | 10/2008 | Rinzler | 136/252 |

OTHER PUBLICATIONS

PCT/US2007/025235, PCT International Search Report citing 4 US patents and Written Opinion dated Feb. 25, 2008.

\* cited by examiner

*Primary Examiner* — Jenny L Wagner
*Assistant Examiner* — Mark Tornow
(74) *Attorney, Agent, or Firm* — Wong, Cabello, Lutsch, Rutherford & Brucculeri

(57) ABSTRACT

One embodiment of the invention provides a nanostructure layer, comprising: a first population of semiconductor nanocrystals forming electron transport conduits; a second population of semiconductor nanocrystals forming hole transport conduits; and a third population of semiconductor nanocrystals capable of at least one of the following: absorbing light or emitting light.

13 Claims, 6 Drawing Sheets

NANOSTRUCTURED LAYERS, METHODS OF MAKING NANOSTRUCTURED LAYERS, AND APPLICATION THEREOF

CROSS-REFERENCE TO RELATED APPLICATIONS

The present application is a divisional application of U.S. patent application Ser. No. 12/001,581, filed Dec. 11, 2007 (currently allowed) now U.S. Pat. No. 7,785,657, which claims the benefit of U.S. Provisional Application Ser. No. 60/874,043 filed on Dec. 11, 2006. The disclosures of the Application and the provisional application are incorporated herein by reference in their entirety.

FIELD OF THE DISCLOSURE

The present disclosure relates generally to a composition of and method of making nanostructured layers derived from semiconductor nanocrystals that can be incorporated into solar cells, photodetectors, lasers, light emitting diodes, and other optoelectronic devices.

BACKGROUND

Renewable energy from the sun has great potential in reducing dependency on fossil fuels while also providing a cleaner, non-green-house-gas-producing method of power generation. A basic limitation of solar power, however, is its high cost relative to other energy sources. Decreasing the cost per watt can be made possible by improving efficiencies and by decreasing the manufacturing costs of solar cells. Efficiency gains can be realized by increasing the percentage of the solar spectra that is captured and by decreasing loss mechanisms due to charge carrier thermalization, electron/hole recombination, and resistive contact losses. Decreasing solar cell manufacturing costs can also be made possible by utilizing less costly solar cell substrate materials and increasing manufacturing throughput through area device fabrication.

Although the theoretical solar conversion efficiency is 66%, traditional single junction solar cells have a maximum efficiency of only 33%, and in practice, rarely achieve efficiencies greater than 18%. Tandem cells, comprising a multiple stack of junctions where each junction is optimized for progressively longer wavelengths, have achieved significantly higher efficiencies but at even higher costs. Semiconductor quantum dot (QD) based solar cells are ideally suited to increase conversion efficiencies because they have size and compositionally tunable bandgaps and broadband absorption. They are also ideally suited to decrease fabrication costs because they can be deposited over large area planar and nonplanar substrates using low cost spin coating or roll-to-roll processes. "Multi Junction" solar cells comprising layers of quantum dots each with a varying size and/or composition can potentially achieve the greater efficiencies of a tandem cell but at far lower processing costs. Multiple exciton generation (MEG) in lead sulfide quantum dots supplied by Evident Technologies can create more than one electron hole pair per absorbed photon provided that the photon energy is more than twice that of the quantum dot bandgap. By harnessing the MEG process the efficiency loss through charge carrier thermalization could be mitigated and high efficiency solar conversion realized.

Research on quantum dot based solar cells has been ongoing for some time, but it has yet to result in high efficiencies. The vast majority of the research efforts have focused on implementing the nanocrystal colloids into polymer (MEH-PPV, polythiophene, PFO, etc.) solar cells where the quantum dots are either dispersed within a semiconductor polymer, between semiconductor polymer layers, or between a semiconductor polymer layer and an electrode. The interband states present at the inorganic QD/organic polymer interface and QD/polymer band offset result in significant charge carrier recombination, which causes loss of efficiency. The efficiency loss is exacerbated by the organic surfactant layer that envelops colloidal quantum dots. Surfactants enable the particles to disperse in solution, co-solvate with the conjugated polymer, and deposit as a film from solution. Typical surfactants can include TOPO, alkane thiols, and aliphatic amines, all of which are insulators. Any charge transfer from the QDs to the surrounding polymer within solar devices is accomplished through a highly inefficient tunneling process that limits overall device efficiency.

Semiconductor nanocrystals, otherwise known as quantum dots, are tiny crystals typically made of II-VI, III-V, IV-VI, and I-III-VI materials that have a diameter between 1 nanometer (nm) and 20 nm. In the strong confinement limit, the physical diameter of the nanocrystal is smaller than the bulk excitation Bohr radius causing quantum confinement effects to predominate. In this regime, the nanocrystal is a 0-dimensional system that has both quantized density and energy of electronic states where the actual energy and energy differences between electronic states are a function of both the nanocrystal composition and physical size. Larger nanocrystals have more closely spaced energy states and smaller nanocrystals have the reverse. Because interaction of light and matter is determined by the density and energy of electronic states, many of the optical and electric properties of nanocrystals can be tuned or altered simply by changing the nanocrystal geometry (i.e. physical size).

Precise control over nanocrystal size, shape, composition, and surface chemistry allows for the rational engineering of amorphous (i.e. random distribution of colloidal particles within the solid) or crystalline (spatially ordered array of nanocrystals) nanocrystal based colloidal solids. Nanocrystals can be defined by their composition, size, shape, and surface chemistry. All nanocrystals, including semiconductor quantum dots are inherently insoluble without the presence of organic capping molecules referred to as ligands. Ligands have two functional chemical groups, one of which coordinates to the metal atoms comprising the surface of the quantum dot and the other which allows for the nanoparticles to disperse within a given solvent. The strength at which the ligands bind to the nanocrystal surface is dependent on the chemical potential between metal atom and the specific metal coordinating group while the compatibility with a given solvent is dependent upon the magnitude of the polarity or ionization of the opposing moieties. Common metal coordination groups can include phosphine, phosphine oxide, amine, carboxyl, and thiol groups.

Efforts to improve the quality and complexity of assembled colloidal nanocrystals continue to this day. The ability to produce a vast number of nanostructured thin film metamaterials derived from binary populations of colloidal nanocrystals where the particles were self assembled into ordered crystalline lattices has been demonstrated. It has been shown that many types and compositions of nanoparticles can be used including semiconductor quantum dots, several forms of metal nanoparticles, and oxides. By altering the ratio of diameters and the relative concentrations of nanoparticles comprising the nanostructured film many different crystal structures can be formed. Nanostructured layers comprised of single or binary populations of nanoparticles where all the constituents have the same or nearly the same diameter can pack neatly into a hexagonal close packed structure, whereas if the ratio of diameters and/or the prevalence of the various constituents is changed from 1:1 continuously to 1:13 cubic, orthorhombic, and tetragonal symmetries are produced. It has also been found that dipole-dipole and van der Waals forces play a significant role in the symmetries produced.

The limitations of present quantum dot/polymer solar cells, LEDs, and other optoelectronic devices result from energy transport inefficiencies at the organic/inorganic interface. These detrimental effects can be largely mitigated by employing all quantum dot based nanostructured thin layers that are devoid of organic materials in the active region of the optoelectronic devices.

SUMMARY

Aspects of the present invention include inorganic nanostructured layers derived from three or more colloidal quantum dot (semiconductor nanocrystal) populations that can be assembled and processed on a substrate such that each nanocrystal can be in electrical contact with adjacent nanocrystals in the nanostructured film. Nanostructured layers can be constructed such that the first population of nanocrystals creates electron transport conduits, the second population of nanocrystals forms hole transport conduits, and the other populations of nanocrystals can be used for light absorption or light emission depending on the type of optoelectronic device in which the film is incorporated. When incorporated into optoelectronic devices, the nanostructured layers can perform charge transport as well as charge recombination in light emitting devices, or exciton creation and charge separation in light absorbing devices such as solar cells and photodetectors. In conventional semiconductor devices, these functions are performed by distinct semiconductor layers that are in contact to form a junction.

Uses of the nanostructured layer can include solar cells, photodetectors and photodetector arrays, and devices where the nanostructured layers serve the light absorption, charge separation, and charge transport functions. The nanostructured layers may also be used in LEDs, lasers, and other similar optoelectronic devices where the layer can serve the charge transport, charge recombination, and light emission functions. The nanostructured layer may be fabricated over a large area using inexpensive liquid phase deposition techniques, self assembly, and thermal sintering or chemical cementing techniques described herein. Optoelectronic devices comprising the nanostructured layers can exhibit increased charge carrier mobilities and reduced nonradiative recombination losses in comparison to QD/polymer hybrid devices due to the elimination of the inorganic/organic interface at the semiconductor nanocrystal/polymer or ligand boundary.

DETAILED DESCRIPTION

Composition of the Layer

Figure 1:
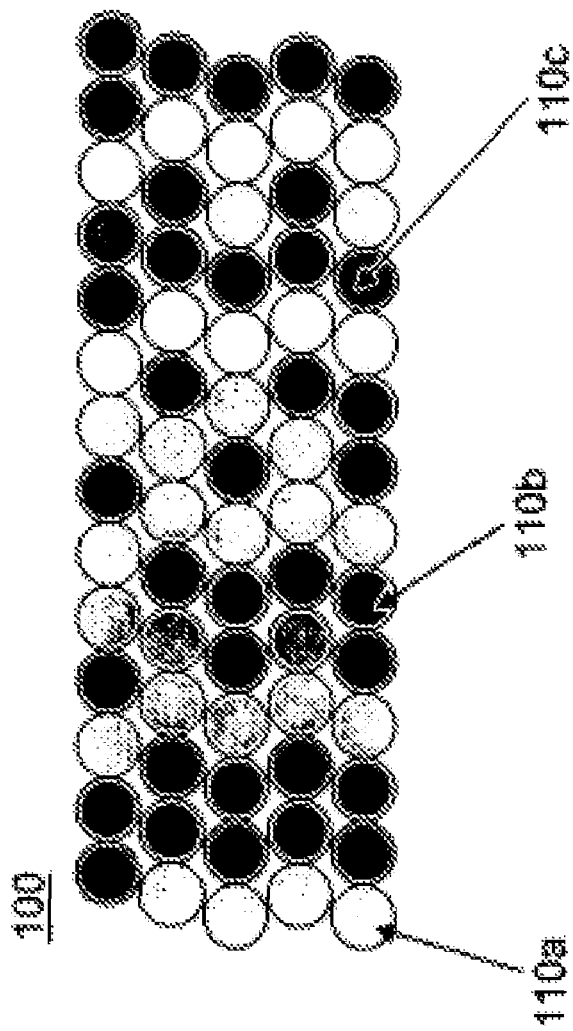
FIG. 1 is an illustration of a nanostructured layer embodying aspects of the present invention.

FIG. 1 illustrates an all inorganic nanostructured layer 100 embodying aspects of the present invention. The nanostructured layer 100 can be comprised of three or more populations of semiconductor nanocrystals (quantum dots) 110a-c. The nanocrystals 110a-c can be in electrical contact with adjacent nanocrystals, and the nanostructured layer 100 can be devoid of residual organic moieties. The nanostructured layer 100 can be constructed such that the first population of nanocrystals 110a creates electron transport conduits, the second population of nanocrystals 110b forms hole transport conduits, and the other populations of nanocrystals 110c can be used for light absorption or light emission depending on the type of optoelectronic device in which the film is incorporated.

Figure 2A:
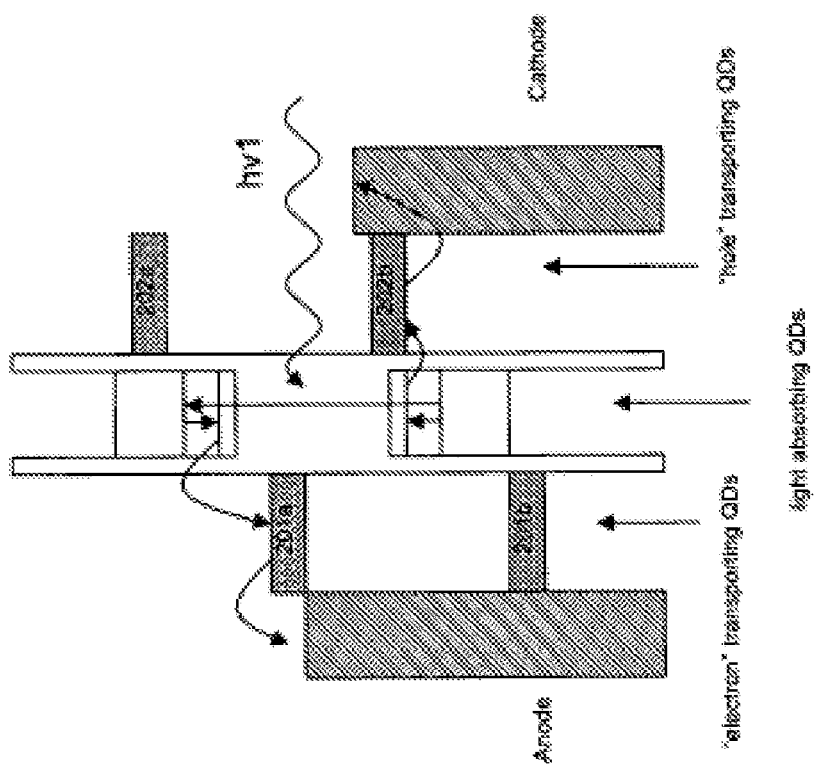
FIG. 2a is the band diagram of a photovoltaic device showing the relative bandgaps and bandoffsets of the nanocrystals comprising the nanostructured layer.
Figure 2B:
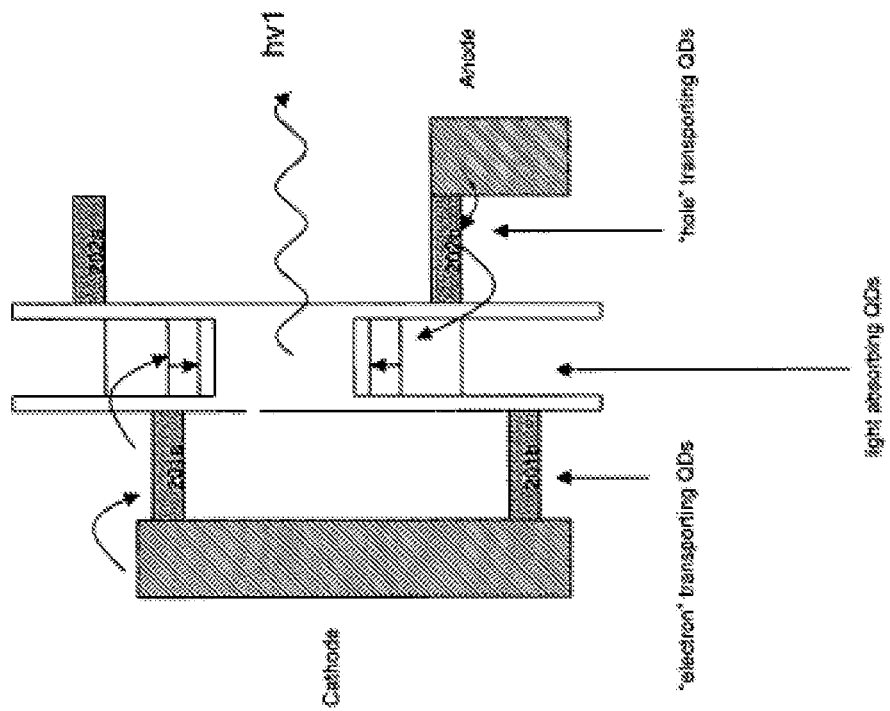
FIG. 2b is the band diagram of a light emitting device showing the relative bandgaps and bandoffsets of the nanocrystals comprising the nanostructured layer.

Thus, the proposed nanostructured film illustrated in FIG. 1 can be described as an interpenetrated type II heterojunction sensitized with semiconductor nanocrystals that retain size and compositionally dependent energy states (i.e. quantum confinement). The alignment of the band gaps (and modified bandgaps due to quantum confinement effects) can be selected in order to create, separate, and transport charge carriers via a band structure shown in FIG. 2a for photovoltaic devices and FIG. 2b for light emitting devices employing nanostructured layers, where the relative height and separation between elements 201a and 201b and 202a and 202b illustrate the bandgaps and bandoffsets of the first and second populations of nanocrystals.

Figure 3A:
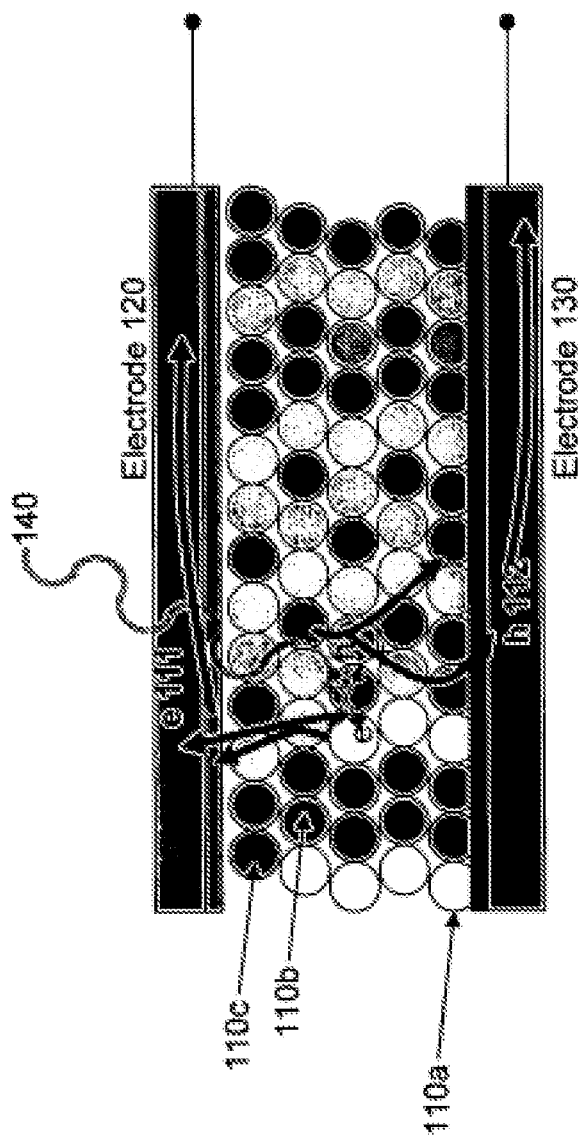
FIG. 3a is an illustration of a nanostructure layer embodying aspects of the present invention. The nanostructure layer is configured to absorb light.
Figure 3B:
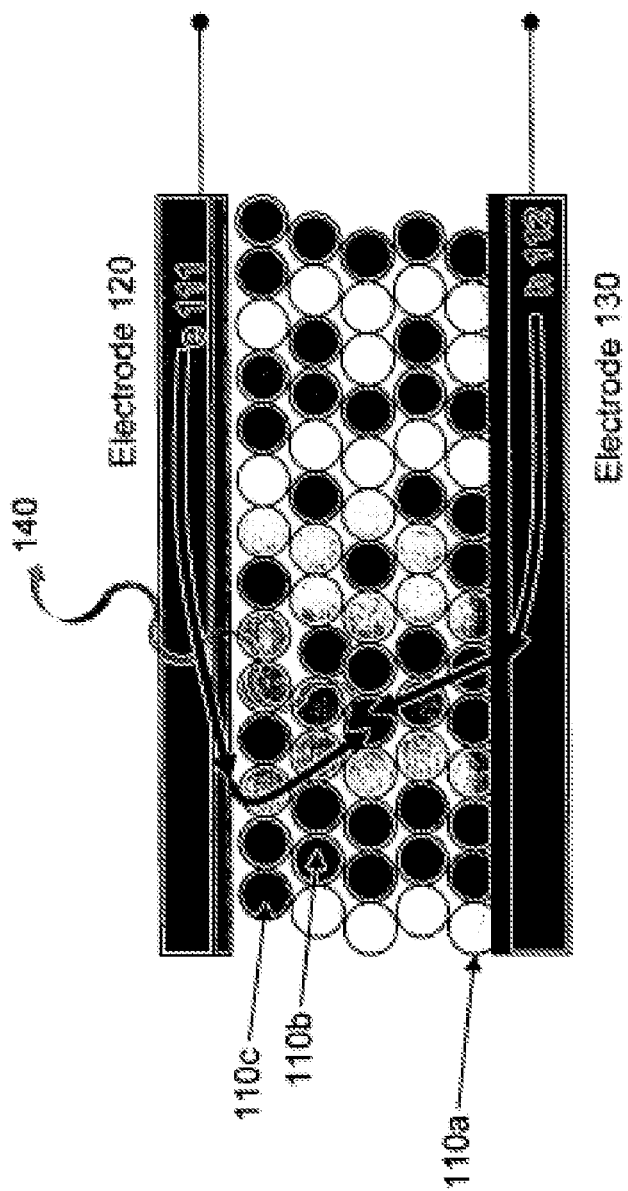
FIG. 3b is an illustration of a nanostructure layer embodying aspects of the present invention. The nanostructure layer is configured to emit light.

FIGS. 3a and 3b illustrate further aspects of embodiments of the present invention. FIG. 3a illustrates a nanostructure layer configured to absorb light 140. An aspect of the present invention includes having enough nanocrystals of the first population 110a in electrical contact with each other to form an electron transport conduit to a first electrode, such as an anode 120, and having enough nanocrystals of the second population 110b in electrical contact with each other to form hole transport conduits to a second electrode, such as a cathode 130, when light 140 is absorbed by the third population 110c of nanocrystals. The electrons 111 and holes 112 of FIGS. 3a and 3b are shown as "e" and "h" respectively. Because the other populations of nanocrystals 110c comprising the layer provide exciton formation in light absorbing optoelectronic devices, it is not necessary that they are in electrical contact with nanocrystals of the same population. However, nanocrystals of the third (or other) populations 110c must be in electrical contact with nanocrystals of both the first 110a and second 110b populations of nanocrystals. In order to achieve this condition in a three dimensional layer the ratio of the first 110a and second 110b populations of nanocrystals can be approximately 1:1 and comprise at least approximately 40% and up to approximately 70% of the layer while the ratio of each of the other populations of nanocrystals (third 110c, optional fourth, optional fifth, optional sixth populations etc.) to the sum of the first 110a and second 110b populations can be between 60% and 30%. Direct electrical contact may refer to direct physical contact made between the nanocrystal cores of adjacent nanocrystals as a result of sintering or chemical cementing, or may refer to a condition where the nanocrystal cores are in close enough proximity (approximately <50 angstroms) where Forster or Dexter energy transfer between adjacent nanocrystal cores may occur. Creating electrical contact between adjacent nanocrystals of the same population can result in a loss of the quantum confinement characteristics indicative of nanoscale semiconductor quantum dots. Thus the first 110a and second 110b populations of semiconductor nanocrystals might not exhibit energy levels associated with 3-d electron/hole energy quantization (although they may exhibit confinement in 2 dimensions). However, the third (and other) populations 110c of nanocrystals that are not in electrical contact with adjacent nanocrystals of the same populations can retain the discrete energy levels associated with quantum confinement of charge carriers in all 3 dimensions.

In one embodiment of the present invention, the first 110a and second 110b populations of nanocrystals can exhibit a band offset from one another such that the conduction and valence bands of the first population (electron conducting) is lower than the conduction and valence bands of the second population (hole conducting).

FIG. 3b illustrates a nanostructure layer similar to the one in FIG. 3a, but instead of being configured for a light absorbing device (as in FIG. 3a), it configured for light emitting devices (LEDs, lasers etc.). For light emitting devices, the other populations of nanocrystals 110c can have a conduction band that is lower than that of the first population 110a of nanocrystals and valence bands higher than that of the second population 110b of nanocrystals. In light absorbing devices (FIG. 3a) such as solar cells, photodetectors, and photodetector arrays, the other populations 110c of nanocrystals can have a conduction band that is higher than the first population 110a (but not higher than the conduction band of the second population 110b) of nanocrystals, and valence bands that are lower than the valence bands of the second population 110b of nanocrystals (but not lower than the valence bands of the first population of nanocrystals).

Optoelectronic devices comprising the nanostructured layers can exhibit increased charge carrier mobilities and reduced nonradiative recombination losses in comparison to QD/polymer hybrid devices due to the elimination of the inorganic/organic interface at the semiconductor nanocrystal/polymer or ligand boundary. By sintering or chemically cementing the assembled ordered quantum dots arrays, vast improvements in charge mobilities can be achieved.

Figure 4:
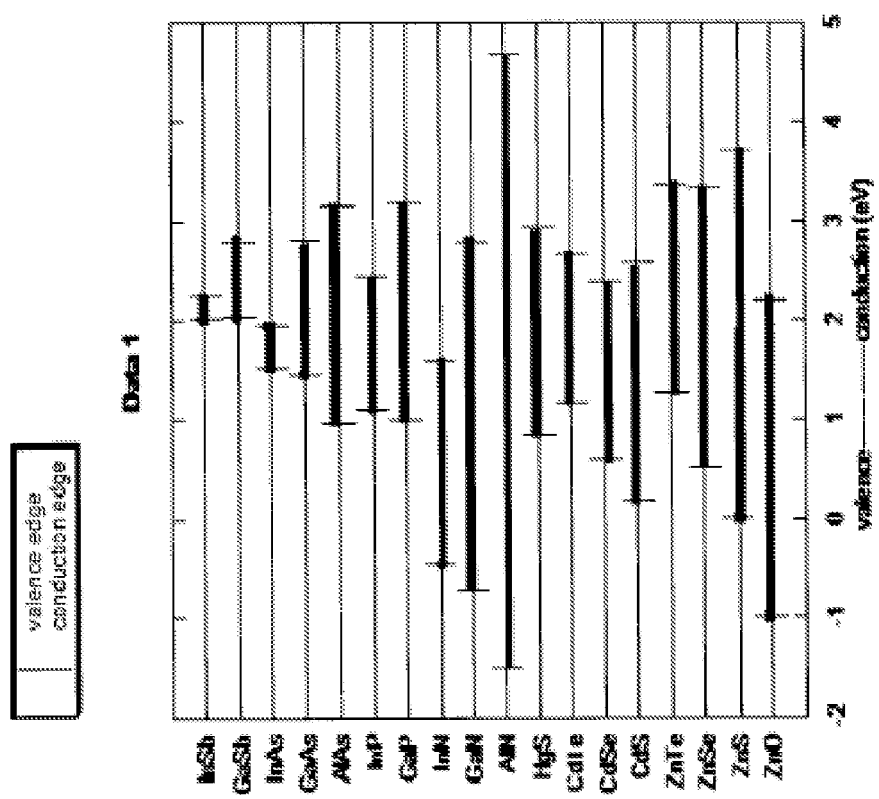
FIG. 4 is a chart of the bandgaps and band offsets of a selection of semiconductor material.

A limited set of bulk bandgaps and band offsets of various semiconductor materials of which quantum dots are composed is shown in FIG. 4. Because quantum confinement can result in a tunable blue shifted bandgap, there is significant flexibility in the material compositions that can be chosen. Example materials having bandgaps that may be used to build the desired sensitized tune II heterostructure described earlier can be chosen from FIG. 4 or the list of nanocrystal compositions given below. A nonlimiting example of a three component nanocrystal system that could be used in the interpenetrated network of sensitized type II heterostructures includes InP as a light harvesting multiple exciton generating nanocrystal, CdSe as the electron conducting quantum dot, and CdTe as the hole conducting nanocrystal. All three nanocrystal components may be selected from II-VI, III-V, IV-VI, and I-III-VI semiconductors and their alloys including the following compositions: PbS, PbSe, PbTe, GaP, InP, InGaP, InSb, AlInN, CuInGaS, CuInGaSe, ZnCuInGaS, CdSe, CdS, CdTe, ZnS, ZnSe, HgTe, GaN, InGaN etc. where the core nanocrystal may or may not be coated with one or more layers of semiconductor shell. Nanocrystals comprising $TiO_2$, ZnO and other wideband gap semiconductors may also be used as one or more of the populations comprising the nanostructured layer.

Method of Manufacture

A method of fabricating the quantum dot based all-inorganic nanostructure film discussed above may contain the following steps:

1. Synthesizing the one or more species of colloidal quantum dots (semiconductor nanoparticles) through a process such as a liquid phase chemical process.

2. Modifying the surfaces of the quantum dots with volatile organic molecules. A nonlimiting example of a volatile organic ligand can include pyridine.

3. Combining the species of quantum dots in a solvent at appropriate ratios.

4. Assembling ordered quantum dot solids on the lower electrode layer by slow precipitation of QDs through controlled evaporation of the solvent from the QD dispersion.

5. Removing the volatile organic molecules on the quantum dot surfaces through a thermal heating process.

6. Sintering the quantum dots assembled on the substrate together to form a contiguous low defect nanostructured film capable of absorbing the appropriate wavelengths of light, separating the charge carriers, and effectively transporting the charge carriers to opposite electrodes. Sintering can be facilitated by exposing the nanostructured layer to elevated temperatures that cause the surfaces of adjacent nanocrystals to fuse. This temperature can be significantly lower for nanoparticles than for bulk materials of the same composition. Rapid thermal annealing may be employed to avert the potential of elemental diffusion during the sintering process.

7. Post processing the sintered nanostructured film with compounds that can intercalate into any voids within the film and passivate residual defects. Nonlimiting examples include hydrazine, bidentate amines, such as ethylene diamine and pyrazine.

8. Application of the upper electrode via thin film deposition methods such as sputtering and evaporation known in the art.

Alternatively, improved nanoparticle interfaces within the nanostructured thin film may be achieved via a chemical cementing approach rather than through sintering. In this approach the nanoparticle cores can be synthesized with or later combined with excess precursors. The nanoparticle dispersion(s) with excess precursors can be deposited and assembled on a substrate and further heated to drive off volatile solvents and ligands while simultaneously reinitiating the chemical synthetic pathways that deposit semiconductor materials within the interstices between the assembled nanoparticles. Through such a process the nanoparticles comprising the nanostructured thin layers may be "glued" together with semiconductor material.

Another example of a chemical cementing approach can be useful in the enhancement of semiconductor grain size. As the nanoparticles are heated to the annealing temperature, they can fuse together to form a large grain. As the grain size grows, the migration of the grain boundary can become sluggish. Ultimately, the grain stops growing. An aspect of the present invention includes allowing the grain size to continue to grow upon the treatment of chemical cementing technique. To amplify, the nanoparticle dispersion(s) are deposited and assembled on a substrate and further annealed up to a temperature. Due to the presence of ligands, particle size and grain boundaries, the resultant film is likely porous. Then, the film is infiltrated with another nanoparticle dispersion(s), followed by another annealing step. Such approach provides further nutrients for the grain to grow and the grains to fuse at annealing temperature, and so alleviates the grain boundary problem.

An extension of the chemical cementing described above is to infiltrate a different nanoparticle dispersion into the annealed film. Such approach can provide a method to create a nanoscale n-p junction or "heterojunction" solar cell.

Typical precursor compounds used in semiconductor nanoparticle synthesis comprise the elements destined to be incorporated within the nanoparticle where the elements typically incorporated into semiconductor nanoparticles come from the metal, chalcogenide, or pnictide families. The portion(s) of the precursor compounds not incorporated into the growing nanocrystals can be denoted as the carrier portion. Nonlimiting examples of the carrier portions of precursors can include anions, (if metal salts are used as a subset of precursors), ligands, organic complexes etc. In this embodiment, the carrier portion of the excess precursors as well as the ligands that envelop the growing nanocrystal can have low vapor pressures (i.e. can be volatile) or can be easily eliminated by a further solvent washing step. The carrier portions of the excess precursors or the ligands that envelop the growing nanoparticle can comprise or have associated with them ions that facilitate crystal growth. For example sodium (Na) ions have been shown to facilitate crystal growth in CIS and CIGS based solar cells and the chlorine ions (Cl) derived from cadmium chloride have been shown to facilitate crystal growth in thin film CdTe solar cells. Nonlimiting examples of suitable precursors can include pyridine, pyrazine, picolinic acid, short chain amine coordinated Cd, Pb, Zn, In, Cu, Ga, Hg, Te, Ag, Au, etc.; or chloride acetates of Cd, Pb, Zn, In, Cu, Ga, Hg, Te, Ag, Au.

In this embodiment of the present invention, the method of the fabrication of the quantum dot based all-inorganic nanostructure film discussed may contain the following steps:

1. Synthesizing one or more species of colloidal semiconductor nanocrystals utilizing volatile ligands and an excess of precursors.

2. Combining the species forms of quantum dots in a solvent at appropriate ratios.

4. Assembling ordered quantum dot solids on the lower electrode layer by slow precipitation of QDs through controlled evaporation of the solvent from the QD dispersion.

5. Removing the volatile organic molecules on the quantum dot surfaces and reacting the excess precursors within the interstitial spaces between assembled nanoparticles in order to deposit semiconductor material between them through a thermal heating process.

6. Optional further low temperature sintering of the quantum dots assembled on the substrate together to form a contiguous low defect nanostructured film capable of absorbing the appropriate wavelengths of light, separating the charge carriers, and effectively transporting the charge carriers to opposite electrodes.

7. Optional post processing of the sintered nanostructured film with compounds that can intercalate into any voids within the film and passivate residual defects. Nonlimiting examples include hydrazine, bidentate amines, ethylene diamine.

8. Application of the upper electrode via thin film deposition methods such as sputtering and evaporation known in the art.

Applications

An all inorganic nanostructured layer, such as the one shown in FIG. 4a, may be incorporated into photovoltaic devices including solar cells, photodetectors, and photodetector arrays where the layer is deposited between a cathode 130 and anode 120. In these applications, the third population 110c of nanocrystals which retain their respective quantum confinement characteristics provide the light absorption function via photogenerated exciton formation. The electrons 111 and holes 112 comprising the excitons are separated into the electron and hole transporting conduits formed by the sintered or cemented first 110a and second 110b nanocrystal populations, whereupon they are transported to the anode 120 and cathode 130 respectively. In one embodiment of the invention the third population 110c of nanocrystals exhibit multiple exciton generation where incident photons (from the light source 140) having energy greater than twice the lowest energy level (1s-1s) of the nanocrystals create more than one exciton when they are absorbed. In another embodiment of the invention, more than three populations of nanocrystals can be incorporated into the nanostructured layer, where the third, fourth, fifth etc. populations each have a different bandgap and thus have different absorption spectra. In both embodiments, the final structure can be best described as an interpenetrated network of sensitized type II heterostructures where multiple exciton generation occurs within a narrow bandgap quantum dot light harvester and where the electrons and holes are separated to the hole conducting and electron conducting components.

The combined effects of multiple exciton generation as well as light 140 absorption in the electron and hole conducting QDs can greatly increase the light 140 capturing ability of the resultant solar cell and greatly decrease efficiency losses due to thermalization of the photoexcited charge carriers. Thus, improvements of photovoltaic conversion can be achieved by increasing charge pair generation coupled with improved charge mobility through sintering/chemical cementing and post sintering passivation steps.

The present invention combines the best features of inorganic photovoltaic devices and organic PV devices. Inorganic solar cells have excellent charge transport and light absorption properties while organic solar cells are capable of low cost, large area liquid phase processing. Improved solar conversion efficiencies over that of the quantum dot/polymer solar cells demonstrated in the literature are possible by increasing charge mobility through the quantum dot layer by eliminating the inorganic/organic interface altogether.

In another embodiment of the present invention, shown in FIG. 4b, the nanostructured layer is used in light emitting devices, such as light emitting diodes, light emitting diode arrays, laser diodes etc. In light emitting applications electrons 111 and holes 112 are transported from the cathode 130 and anode 120 via electron and hole conduits formed from nanocrystals of the first 110a and second 110b populations. Electrons 111 and holes 112 recombine within the third population 110c of semiconductor nanocrystals resulting in light 140 emission, where the wavelength of the emitted light 140 is dependent upon the size and composition of the third population 110c of nanocrystals. The peak wavelength may be in the UV, visible or infrared portions of the spectrum. In another embodiment of the invention more than three populations of nanocrystals comprise the nanostructured layer, where the third, fourth, fifth and other populations (other than the first 110a and second 110b populations) each have different size and compositionally dependent bandgaps such that each population of nanocrystals emits light 140 with a different peak wavelength. Thus, the combination of the light emitted 140 from all light emitting populations of nanocrystals may create white light, broadband or polychromatic infrared light, or polychromatic visible light (i.e. pinks, purples, pastels and other colors).

For all optoelectronic devices, optional electron barrier layers or other layers that inhibit the transport of charge carriers to the inappropriate electrode or facilitate their transport to the appropriate electrode may be interposed between the nanostructured layer and electrodes. Nanostructured layers may be incorporated as one of a succession of vertically deposited layers on a substrate forming a "sandwich" or may be deposed between interdigitated electrodes where the anode and cathode lie laterally to the nanostructured layer.

The previous description of embodiments is provided to enable a person skilled in the art to make and use the present invention and are not intended as being limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance, and it is contemplated that steps may be added or removed. Various modifications to these embodiments will be readily apparent to those skilled in the art. Therefore, the present invention is not intended to be limited to the embodiments described herein but is to be accorded the widest scope defined only by the claims below and equivalents thereof.

The invention claimed is:

1. A nanostructure layer, comprising:
    a first population of semiconductor nanocrystals forming electron transport conduits, the first population of semiconductor nanocrystals having first valence and conduction bands;
    a second population of semiconductor nanocrystals forming hole transport conduits, the second population of semiconductor nanocrystals having second valence and conduction bands; and
    a third population of semiconductor nanocrystals, the third population of semiconductor nanocrystals having third valence and conduction bands;
    wherein the first, second, and third valence and conduction bands are each different and wherein the first, second, and third populations form an interpenetrated network.

2. The nanostructure layer of claim 1, wherein the third population of semiconductor nanocrystals provide either exciton formation or recombination.

3. The nanostructure layer of claim 1, wherein the ratio of the first population and second population is approximately 1:1.

4. The nanostructure layer of claim 1, wherein the first population and second population comprise between 40% and 70% of the layer.

5. The nanostructure layer of claim 1, wherein nanocrystals of the third population have a conduction band that is higher than a conduction band of nanocrystals of the first population and lower than a conduction band of nanocrystals of the second population, the nanocrystals of the third population further having a valence band that is lower than a valence band of nanocrystals of the second population and higher than a valence band of nanocrystals of the first population.

6. The nanostructure layer of claim 1, wherein the first population and the second population have offset bandgaps, and the third population has a bandgap that is smaller than the bandgap of the first population and smaller than the bandgap of the second population.

7. The nanostructure layer of claim 1, wherein the seimconductor nanocrystals of the third population are capable of absorbing electromagnetic radiation and creating pairs of electrons and holes, the electrons being transported to semiconductor nanocrystals of the first population and the holes being transported to semiconductor nanocrystals of the second population.

8. The nanostructure layer of claim 1, wherein semiconductor nanocrystals of the third population are capable of absorbing light through a multiple exciton generation process.

9. The nanostructure layer of claim 1, wherein semiconductor nanocrystals of the third population are capable of recombining electrons and holes transported from the first population and the second population of semiconductor nanocrystals to emit light of a specific wavelength.

10. The nanostructure of claim 9, wherein the semiconductor nanocrystals of the third population have a conduction band lower than a conduction band of nanocrystals of the first population, the nanocrystals of the third population further having a valence band higher than a valence band of nanocrystals of the second population.

11. The nanostructure of claim 1, wherein the semiconductor nanocrystals of the first population comprise CdSe, the semiconductor nanocrystals of the second population comprise CdTe, and the semiconductor nanocrystals of the third population comprise InP.

12. The nanostructure of claim 1, wherein the semiconductor nanocrystals of the first, the second, and the third populations are selected from the group consisting of II-VI, III-V, IV-VI, and I-III-VI semiconductors.

13. The nanostructure layer of claim 1, wherein the third population of semiconductor nanocrystals is capable of emitting light.

* * * * *